United States Patent [19]

Stone et al.

[11] Patent Number: 4,761,311
[45] Date of Patent: Aug. 2, 1988

[54] PROCESS FOR GLOSSING A DEVELOPER SHEET AND AN APPARATUS USEFUL THEREIN

[75] Inventors: Benjamin C. Stone, Waynesville; D. Scott Proehl, Miamisburg, both of Ohio

[73] Assignee: The Mead Corporation, Dayton, Ohio

[21] Appl. No.: 17,102

[22] Filed: Feb. 19, 1987

[51] Int. Cl.$^4$ .............................. B05D 3/12
[52] U.S. Cl. .................. 427/366; 428/327; 219/216; 219/469; 118/59; 118/60
[58] Field of Search ............. 427/150, 366; 428/327; 219/216, 469; 118/59, 60

[56] References Cited

U.S. PATENT DOCUMENTS

| | | | |
|---|---|---|---|
| 1,399,160 | 12/1921 | Sevigne | 118/59 |
| 1,913,704 | 6/1933 | Elkan | 118/59 |
| 3,349,222 | 10/1967 | Johnston | 118/59 |
| 3,478,665 | 11/1969 | Umahashi et al. | |
| 3,517,164 | 6/1970 | Huggins et al. | 219/388 |
| 3,621,201 | 11/1971 | Crane et al. | 219/388 |
| 3,857,189 | 12/1974 | Katayama et al. | 34/95 |
| 3,902,041 | 8/1975 | May | 219/216 |
| 4,059,394 | 11/1977 | Ariyama et al. | 432/59 |
| 4,147,922 | 4/1979 | Naeser et al. | 219/216 |
| 4,464,561 | 8/1984 | Hulin | 219/216 |
| 4,537,492 | 8/1985 | Lein et al. | 355/3 FU |
| 4,596,920 | 6/1986 | Inagaki | 219/469 |

Primary Examiner—Thurman K. Page
Assistant Examiner—L. R. Horne
Attorney, Agent, or Firm—Biebel, French & Nauman

[57] ABSTRACT

A process for glossing a developer sheet and an apparatus useful therein are provided. The developer sheet has a thermoplastic developer resin on the surface thereof wherein the thermoplastic developer resin is capable of forming a film which imparts gloss upon the applications of heat thereto. In the process, an arched plate is heated to a temperature sufficient to cause the thermoplastic developer resin to coalesce. The arched plate has a heat transfer limiting blanket thereon to maintain the flatness of the developer sheet. The developer sheet is fed between the convex side of the heated arched plate and a belt held snugly against the plate. The belt is driven so as to move the developer sheet over the heated arched plate.

9 Claims, 2 Drawing Sheets

PROCESS FOR GLOSSING A DEVELOPER SHEET AND AN APPARATUS USEFUL THEREIN

BACKGROUND OF THE INVENTION

The present invention relates to a process for glossing a developer sheet and an apparatus useful therein.

The developer sheet of the present invention can be used in conjunction with conventional pressure-sensitive copy paper or photosensitive imaging systems employing microcapsules to provide visible images upon contact with a color precursor which is image-wise released from the microcapsules and transferred to the developing sheet.

Photosensitive imaging systems employing microencapsulated radiation sensitive compositions are the subject of commonly assigned U.S. Pat. Nos. 4,399,209 and 4,416,966 as well as copending U.S. patent application Ser. No. 320,643, filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Exposure image-wise hardens the internal phase of the microcapsules.

U.S. Pat. No. 4,399,209 discloses a transfer system in which the imaging sheet is assembled with a developer sheet prior to being subjected to a rupturing force. Upon passing through the pressure rollers in contact with the developer sheet, the microcapsules rupture and image-wise release the internal phase whereupon the color precursor migrates to the developer sheet where it reacts with a dry developer and forms a color image. The imaging system can be designed to reproduce monochromatic or polychromatic full color images.

Processes for glossing a developer sheet are known in the art. In most cases, heat is used to provide a glossy finish while in some situations, heat and pressure are used. For example, see commonly assigned U.S. Pat. No. 4,554,235. Typically, the developer sheet is glossed by heating in contact with a heated roller or a pair of heated rollers. Also, the developer sheet can be passed over a heated platen. Alternatively, the developer sheet can be placed in a hot oven.

Heated convex surfaces are useful for imparting heat to sheet material. For example, in U.S. Pat. No. 1,399,160, a heated convex surface imparts heat to a paper to which wax is subsequently applied. U.S. Pat. No. 1,913,704 teaches that a heated convex surface imparts heat to a used carbon paper so that the paper coating softens and flows to fill the bare spots on the paper.

A heated convex surface is also used in U.S. Pat. No. 3,621,201 for heat developing paper. The reference teaches the use of a previously exposed heat-sensitive paper such as a non-thermoplastic silver emulsion paper. The paper is fed between the heated convex surface and an endless cloth belt which is held snugly against the convex surface. The belt is driven so as to move the paper over the convex surface. Means are provided for heating the convex surface and controlling the temperature thereof.

Known processes for glossing developer sheets suffer from numerous disadvantages when applied to the present developer sheet. Thermoplastic developer resins, which are capable of forming a film upon the application of heat, are extremely sticky compared to dry silver film, conventional film and xerographic copies; thus, the release conditions of the developer sheet surface are more critical. In hot roller glossing methods, the high contact pressure causes adhesion of the thermoplastic developer resin to the hot rollers. In methods involving heated surfaces, adhesion of the thermoplastic developer resin is also a problem. In addition, an excessive heat transfer rate from the heated surface can ruin the flatness of the sheet. Also, known glossing methods do not achieve an even gloss with respect to image density and are also slow. Additionally, the energy requirements of glossing processes are higher than known photographic, glossing and xerographic toner fusing technologies.

Thus, a need exists in the art for a process for glossing developer sheets and an apparatus useful therein wherein no adhesion of the thermoplastic developer resin to another surface results, sheet flatness is maintained, a more even gloss with respect to image density is achieved and a high throughput is achieved.

SUMMARY OF THE INVENTION

In accordance with the present invention, a process is provided for glossing a developer sheet having a thermoplastic developer resin on the surface thereof. Certain thermoplastic resins are capable of forming a film which imparts gloss to the sheet upon the application of heat. This film is essentially transparent. The film imparts a gloss finish when the image is formed on an opaque background and it transmits light efficiently when the image is formed on a transparent background to provide a transparency.

In accordance with one embodiment of the present invention, an arched plate is heated to a temperature sufficient to cause a thermoplastic developer resin to soften. A developer sheet is then fed between the convex side of the heated plate and a continuous belt held snugly against the convex side of the plate so that the surface of the sheet with the thermoplastic developer resin is adjacent to the belt. The belt is driven so as to move the developer sheet over the arched plate. The sheet then passes from between the arched plate and the belt. Unlike hot roller processes where the high contact pressure of the hot rollers on the developer sheet causes adhesion of the thermoplastic developer resin to the hot rollers, the present process is advantageous because no distinct contact points exist between the belt and the arched plate and thus, minimal contact pressure is exerted on the developer sheet. Hence, the adhesion between the thermoplastic developer resin on the developer sheet and the belt is minimized.

The arched plate has a heat transfer limiting blanket thereon. Known uses of heated convex surfaces have suffered because the excessive heat transfer rate from the heated convex surface to the sheet ruins the flatness of the sheet. This problem has been overcome by the use of a heat transfer limiting blanket on the heated convex surface. The blanket reduces the heat transfer rate and thus, the developer sheet flatness is maintained in the present process for glossing a developer sheet.

Known processes are disadvantageous in that in order to compensate for the lack of gloss on the light areas of developer sheets, a higher heat is used which compounds the adhesion associated with the thermoplastic developer layer. The present process overcomes this problem. The physical mechanism involved is not fully understood; however, it is theorized that the surface action of the belt on the developer sheet plays a major role in providing even gloss with respect to image density.

Additionally, the process and apparatus of the present invention provide a throughput greater than 30 ppm without parallel processing.

Therefore, an object of the present invention is to provide a process for glossing a developer sheet and an apparatus useful therein.

A further object of the present invention is to provide a process for glossing a developer sheet wherein no adhesion of the developer sheet coating to the belt results.

An additional object of the present invention is to provide a process for glossing a developer sheet wherein the sheet flatness is maintained.

Another object of the present invention is to provide a process for glossing a developer sheet wherein a more even gloss with respect to image density is achieved.

A more particular object of the present invention is to provide an apparatus for glossing developer sheets wherein a high throughput is achieved.

Other objects and advantages of the present invention will become apparent from the following description, attached drawings and appended claims.

DETAILED DESCRIPTION OF THE INVENTION

Figure 1:
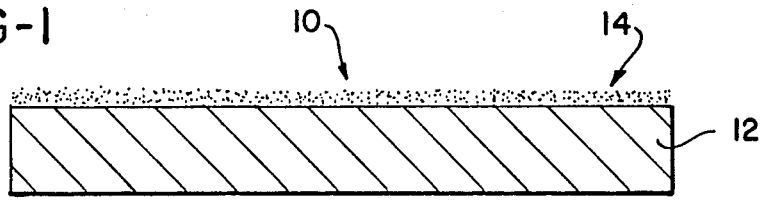
FIG. 1 is a cross-sectional schematic view of a developer sheet useful in the process of the present invention.

A developer sheet useful in the process of the present invention is schematically shown in FIG. 1 wherein the developer sheet is designated generally by the reference numeral 10. The sheet 10 includes a support 12 which is overcoated by a layer 14 of a finely divided thermoplastic developer resin. Useful materials for the support 12 include both opaque substrates such as paper and transparent substrates such as a polyethylene terephthalate film. However, preferably, the support 12 is paper.

Upon image-wise transfer of a color precursor to the surface of sheet 10, a visible image 16 is formed in layer 14 as shown by the cross-hatching. The visible image 16 is usually the product of an acid-base reaction between the color precursor, which is usually an electron donor, and the thermoplastic developer resin, which is usually an electron acceptor.

Figure 2:
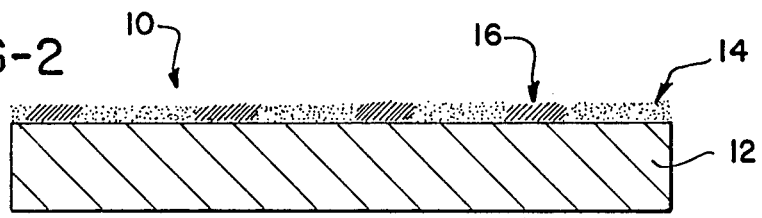
FIG. 2 is a view of the developer sheet of FIG. 1 after image-wise transfer of the color precursor thereto.
Figure 3:
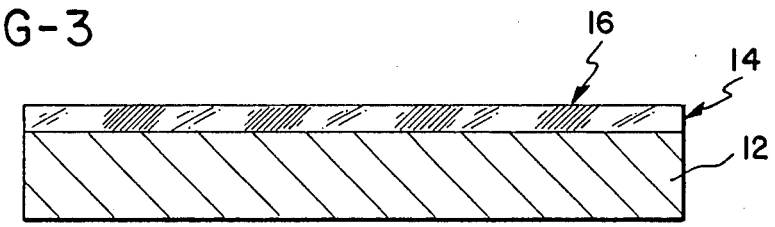
FIG. 3 is a view of the developer sheet of FIG. 2 after coalescing of the thermoplastic developer resin to provide a high gloss finish.
Figure 4:
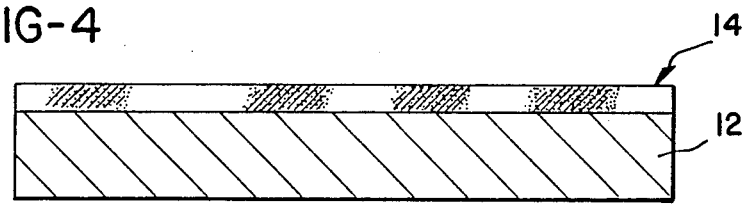
FIG. 4 is a view of the developer sheet of FIG. 2 after partial coalescing of the thermoplastic developer resin to provide a matte finish.

After developing the image 16, the developer sheet 10 is subjected to the process of the present invention to gloss the thermoplastic developer resin on the developer sheet. By varying the process temperature, degrees of gloss ranging from matte to low gloss to high gloss can be obtained. For example, FIG. 3 schematically illustrates a high gloss finish on the developer sheet 10. The thermoplastic developer resin 14 is essentially completely coalesced into a thin, continuous, translucent film. An intermediate degree of gloss is schematically shown in FIG. 4 in which partial coalescence of the layer 14 gives a finish which is glossier than the uncoalesced intermediate of FIG. 2 but less glossy than the finish of FIG. 3. Where the developer sheet is to be used as a transparency, the support film is transparent and complete coalescence of the developer resin is used.

The thermoplastic developer resins useful in the present invention typically have softening points ranging from about 100° to 200° C.

Figure 5:
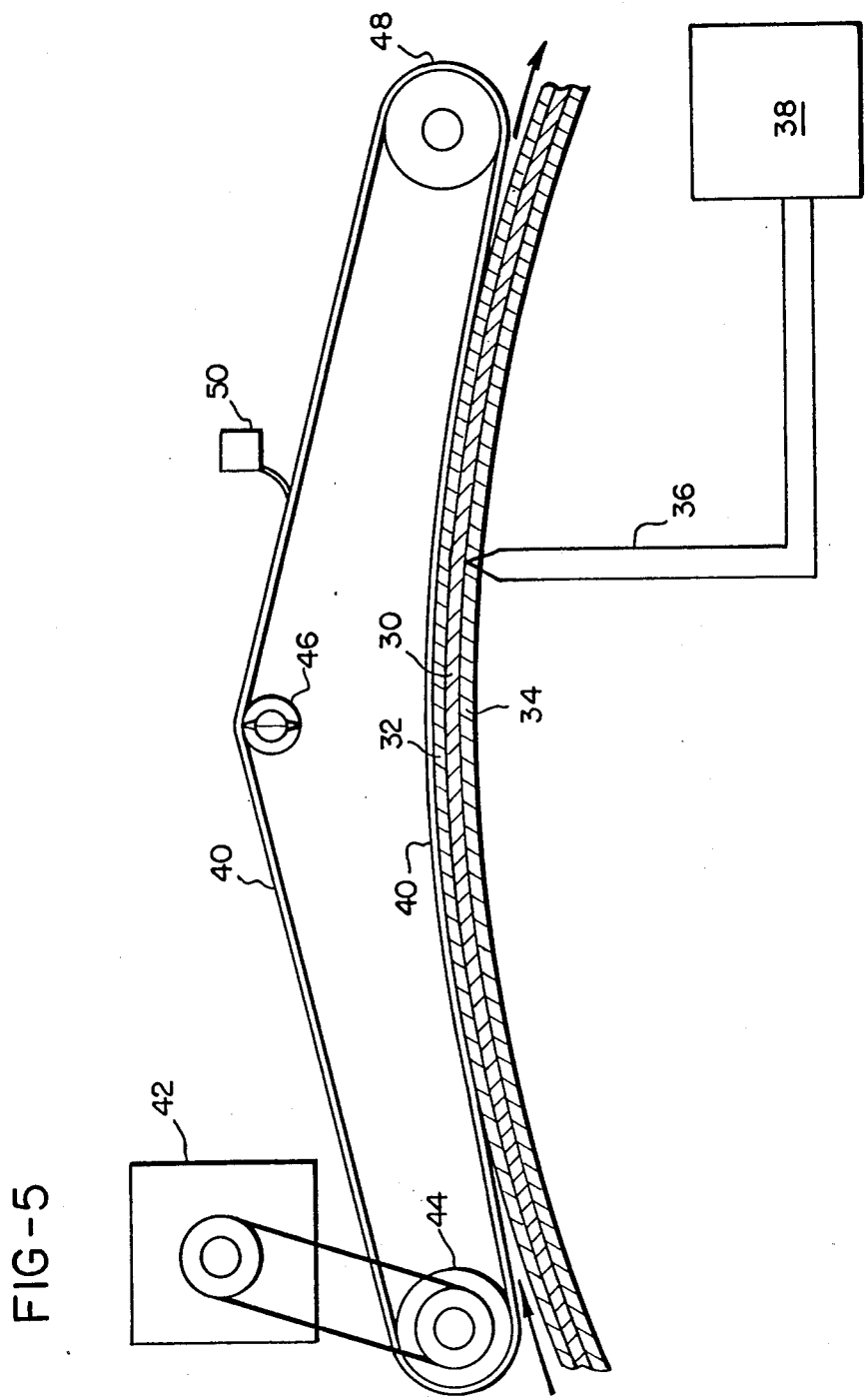
FIG. 5 is a view of an apparatus useful in the process of the present invention.

FIG. 5 illustrates an apparatus useful in the process of the present invention. Arched plate 30 is gauged thin in order to provide a rapid temperature rise at the beginning of the process. Typically, arched plate 30 has a thickness of about 0.081 to 0.229 cm (0.032 to 0.090 in). In a preferred embodiment, the thickness of arched plate 30 is about 0.081 cm (0.032 in). Typically, arched plate 30 is a metallic material such as aluminum or stainless steel; in a preferred embodiment, the arched plate 30 is stainless steel.

Arched plate 30 has a heat transfer limiting blanket 32 thereon. The blanket 32 limits the heat transfer rate from the arched plate 30 to the developer sheet 10. The blanket 32 may be unnecessary at lower throughput rates, i.e., lower plate temperatures. The blanket 32 does enable higher throughput rates, i.e., higher plate temperatures, which would normally ruin sheet flatness. Thus, in a preferred embodiment, blanket 32 is used. Thus, the present process for glossing a developer sheet is advantageous because developer sheet flatness is maintained. Typically, the blanket 32 has a thickness of about 0.038 to 0.152 cm (0.015 to 0.060 in). In a preferred embodiment, the thickness of blanket 32 is about 0.076 cm (0.030 in). Although other useful materials for blanket 32 exist, preferably, blanket 32 is polytetrafluoroethylene. Polytetrafluoroethylene is commercially available from Du Pont De Nemours & Company, E. I. Another useful blanket material is available under the trademark SILVERSTONE from Du Pont.

Various means can be used for heating arched plate 30. In a preferred embodiment, arched plate 30 is heated by means of heating pad 34. Typically, heating pad 34 covers the entire lower surface of arched plate 30. Thus, unlike other methods where a surface is heated by applying heat at one point and allowing heat transfer throughout the surface, the use of heating pad 34 permits uniform heating of arched plate 30. A useful heating pad is commercially available from Electro-Flex Heat, Inc. The power required per unit area is about 0.775 to 1.55 watts/cm$^2$ (5 to 10 watts/in$^2$). Thus, arched plate 30 is interposed between blanket 32 and heating pad 34. Thermocouple 36 monitors the temperature of arched plate 30. Temperature controller 38 maintains the temperature of arched plate 30. Arched plate 30 is heated to a temperature of about 105° to 125° C. The temperature range is as limited at the upper end because adhesion of the thermoplastic developer resin to the belt can occur and at the lower end because uneven glossing with respect to image density can occur.

The developer sheet 10 is fed between the convex side of arched plate 30 and continuous belt 40 held snugly against the convex side of the arched plate 30 so that the surface of the sheet with the layer 14 of thermoplastic developer resin is adjacent to the belt 40. The belt 40 is movable relative to arched plate 30. Because no distinct contact points exist between belt 40 and arched plate 30, the belt 40 exerts minimal contact pressure on the developer sheet 10 so that the adhesion of the thermoplastic developer resin to the belt 40 is minimized. In a preferred embodiment, belt 40 is placed around roller means positioned to hold the belt 40 in intimate contact with the arched plate 30. Motor 42 drives belt 40. In a more preferred embodiment, the roller means consists of a drive roller 44, a tensioning roller 46 and an idler roller 48.

Useful materials for belt 40 include silicone rubber, polytetrafluoroethylene and ethylene-propylene diene terpolymer. Silicone rubber is commercially available as black silicone rubber from Tektronix, Inc. under part #214-1969-01. Polytetrafluoroethylene is commercially available from E. I. du Pont De Nemours & Company, while ethylene-propylene diene terpolymer is commercially available from The Goodyear Tire & Rubber Company. In a preferred embodiment, belt 40 is silicone rubber. Typically, the thickness of belt 40 is about 0.081 to 0.229 cm (0.032 to 0.090 in) while in a preferred embodiment, the thickness is about 0.102 cm (0.040 in).

Typically, belt 40 contacts arched plate 30 for about 16 cm (6.3 in). Thus, developer sheet 10 contacts arched plate 30 for at least 16 cm (6.3 in). Given the foregoing range of temperatures for arched plate 30, a wide range of belt speeds to produce a desired sheet dwell time exists. After a speed is selected, a temperature can accordingly be selected or vice versa. For example, if a slow belt speed is desired, a low arched plate temperature is then chosen or vice versa. Typically, the speed of belt 40 is about 254 to 660 cm/min (100 to 260 in/min); in a preferred embodiment, the speed of belt 40 is about 508 cm/min (200 in/min) and the temperature is 115° C. A given portion of sheet 10 is heated for about 1.4 to 3.8 sec. The main consideration in setting the process variables, i. e., short dwell time and arched plate temperature, is assuring that the thermoplastic developer resin forms a film which imparts gloss to developer sheet 10. Developer sheet 10 then passes beyond arched plate 30 and belt 40.

Of course, sheet dwell time can be varied by changing the sheet path length, since a path increase will permit a higher belt speed with a similar dwell time. This can result in higher throughput.

To reduce static cling between developer sheets, the belt can be subjected to static discharge means 50 prior to contact with developer sheet 10.

Having described the invention in detail and by reference to preferred embodiments thereof, it will be apparent that modifications and variations are possible without departing from the scope of the invention defined in the appended claims.

What is claimed is:

1. A process for glossing a developer sheet having a thermoplastic developer resin on the surface thereof, said thermoplastic developer resin being capable of forming a film which imparts gloss upon the application of heat, comprising the steps of:

heating an arched plate to a temperature sufficient to cause said thermoplastic developer resin to coalesce, said arched plate having a heat transfer limiting blanket thereon;

feeding said sheet between the convex side of said arched plate and a continuous belt held snugly against said convex side of said arched plate so that said surface of said sheet with said thermoplastic developer resin is adjacent to said belt, said belt exerting minimal contact pressure on said sheet;

driving said belt so as to move said sheet over said arched plate; and passing said sheet from between said plate and said belt.

2. The process of claim 1 wherein said arched plate has a blanket of polytetrafluoroethylene.

3. The process of claim 1 wherein said belt is placed around roller means positioned to hold said belt in intimate contact with said arched plate.

4. The process of claim 3 wherein said belt is a silicone rubber.

5. The process of claim 1 wherein said arched plate is heated by a heating pad.

6. The process of claim 5 wherein said arched plate is heated to a temperature of about 105° to 125° C.

7. The process of claim 2 wherein said polytetrafluoroethylene layer has a thickness of about 0.038 to 0.152 cm (0.015 to 0.060 in).

8. The process of claim 1 wherein said belt is driven at a speed of about 254 to 660 cm/min (100 to 260 in/min).

9. The process of claim 3 wherein said belt is subjected to static discharge means prior to contact with said sheet.

* * * * *